(12) United States Patent
Beppu

(10) Patent No.: US 11,290,076 B2
(45) Date of Patent: Mar. 29, 2022

(54) AMPLIFIER CIRCUIT, FRONT-END CIRCUIT, AND RECEIVER CIRCUIT

(71) Applicant: Murata Manufacturing Co., Ltd., Kyoto (JP)

(72) Inventor: Nobuyasu Beppu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 24 days.

(21) Appl. No.: 15/930,879

(22) Filed: May 13, 2020

(65) Prior Publication Data

US 2020/0274508 A1    Aug. 27, 2020

Related U.S. Application Data

(63) Continuation of application No. PCT/JP2018/041740, filed on Nov. 9, 2018.

(30) Foreign Application Priority Data

Nov. 14, 2017  (JP) .............................. JP2017-219174

(51) Int. Cl.
    *H03F 3/72*   (2006.01)
    *H03G 3/10*   (2006.01)
    *H03F 3/19*   (2006.01)
    *H04B 1/16*   (2006.01)

(52) U.S. Cl.
    CPC .................. *H03G 3/10* (2013.01); *H03F 3/19* (2013.01); *H04B 1/16* (2013.01); *H03F 2200/165* (2013.01); *H03F 2200/294* (2013.01); *H03F 2200/451* (2013.01); *H03G 2201/106* (2013.01)

(58) Field of Classification Search
    CPC ...... H03F 3/72; H03G 3/3026; H03G 3/3042; H03G 3/3052
    USPC .................................. 330/51, 144, 151, 284
    See application file for complete search history.

(56) References Cited

U.S. PATENT DOCUMENTS

| 2009/0298455 | A1  | 12/2009 | Takeuchi |           |
|--------------|-----|---------|----------|-----------|
| 2009/0309655 | A1* | 12/2009 | Yamamoto | H03F 1/0261 |
|              |     |         |          | 330/51    |
| 2018/0076774 | A1* | 3/2018  | Pehlke   | H03F 3/72 |

FOREIGN PATENT DOCUMENTS

| JP | S60-19844 B2  | 5/1985 |
|----|---------------|--------|
| JP | 2002-217648 A | 8/2002 |
| JP | 2003-163555 A | 6/2003 |
| JP | 2008-028908 A | 2/2008 |

(Continued)

OTHER PUBLICATIONS

International Search Report issued in Patent Application No. PCT/JP2018/041740 dated Feb. 5, 2019.

(Continued)

*Primary Examiner* — Steven J Mottola
(74) *Attorney, Agent, or Firm* — Pearne & Gordon LLP

(57) ABSTRACT

An amplifier circuit includes a first terminal and a second terminal, an amplifier disposed in a first path connecting the first terminal and the second terminal, a first switch circuit disposed in the first path between the amplifier and the second terminal, an attenuator disposed in the first path between the amplifier and the first switch circuit, and a second switch circuit disposed in a second path that is connected to the first terminal and the second terminal while bypassing the amplifier, the attenuator, and the first switch circuit.

10 Claims, 6 Drawing Sheets

(56) References Cited

FOREIGN PATENT DOCUMENTS

| JP | 2009-239832 A | 10/2009 |
|----|---------------|---------|
| JP | 2009-290411 A | 12/2009 |

OTHER PUBLICATIONS

Written Opinion issued in Patent Application No. PCT/JP2018/041740 dated Feb. 5, 2019.

\* cited by examiner

AMPLIFIER CIRCUIT, FRONT-END CIRCUIT, AND RECEIVER CIRCUIT

This is a continuation of International Application No. PCT/JP2018/041740 filed on Nov. 9, 2018 which claims priority from Japanese Patent Application No. 2017-219174 filed on Nov. 14, 2017. The contents of these applications are incorporated herein by reference in their entireties.

BACKGROUND

Technical Field

The present disclosure relates to an amplifier circuit including a path that bypasses an amplifier, a front-end circuit and a receiver circuit that include the amplifier.

A communication device, such as a mobile terminal includes an amplifier circuit that amplifies a high-frequency signal. As an example of this kind of amplifier circuit, Patent Document 1 discloses an amplifier circuit including an amplifier for amplifying an input high-frequency signal and a bypass path for bypassing the amplifier. In the amplifier circuit, when an input signal is large, the input signal is made to pass along the bypass path and outputted without being input to the amplifier.

Patent Document 1: Japanese Unexamined Patent Application Publication No. 2009-290411

BRIEF SUMMARY

However, in an amplifier circuit having a path that bypasses an amplifier as described in Patent Document 1, there is a problem in that feedback of a high-frequency signal occurs in a bypass path or the like, and the amplifier circuit becomes unstable.

The present disclosure suppresses the unstableness of an amplifier circuit or the like having a bypass path.

An amplifier circuit according to an aspect of the present disclosure includes: a first terminal and a second terminal; an amplifier disposed in a first path connecting the first terminal and the second terminal; a first switch circuit disposed in the first path between the amplifier and the second terminal; an attenuator disposed in the first path between the amplifier and the first switch circuit or between the first switch circuit and the second terminal; and a second switch circuit disposed in a second path that is connected to the first terminal and the second terminal while bypassing the amplifier, the attenuator, and the first switch circuit.

The attenuator may be disposed between the amplifier and the first switch circuit.

The first switch circuit may include one terminal, another terminal, a series-connected switch disposed between the one terminal and the other terminal, and a ground-connected switch disposed between a node between the one terminal and the series-connected switch and a ground terminal, one end of the ground-connected switch may be connected to the node, and another end of the ground-connected switch may be connected to the ground terminal, and the amplifier may be connected to the ground terminal.

The attenuator may be disposed between the first switch circuit and the second terminal.

One end of the second path may be connected to a node between the first terminal and the amplifier, a first matching circuit may be disposed between the first terminal and the node, the second switch circuit may include a plurality of series-connected switches that are disposed in the second path in series, and a second matching circuit may be disposed between at least two of the plurality of series-connected switches.

The attenuator may be a π-type attenuator constituted by a plurality of resistors.

The attenuator may be a T-type attenuator constituted by a plurality of resistors.

When a frequency of a signal input to the first terminal is 1 GHz, a gain of the amplifier may be 10 dB or more and 30 dB or less, and attenuation of the attenuator may be 0.1 dB or more and 1 dB or less.

A front-end circuit according to an aspect of the present disclosure includes the amplifier circuit described above and a filter connected to the first terminal.

A receiver circuit according to an aspect of the present disclosure includes the front-end circuit described above and a signal processing circuit connected to the second terminal.

It is possible to suppress the unstableness of the amplifier circuit having a bypass path.

DETAILED DESCRIPTION

Background of Present Disclosure

Figure 1:
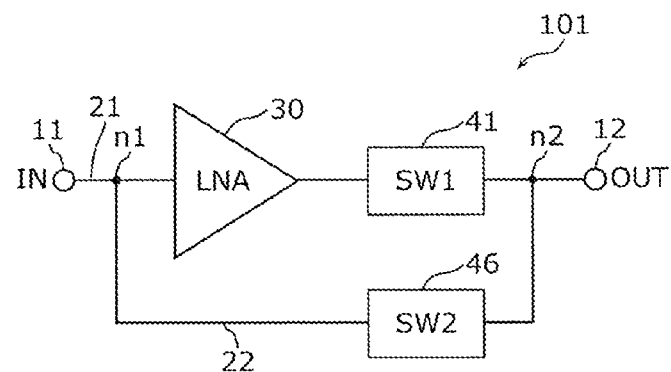
FIG. 1 is a block diagram of an amplifier circuit according to Comparative Example.

First, a background of the present disclosure will be described using an amplifier circuit 101 of Comparative Example as an example. FIG. 1 is a block diagram of the amplifier circuit 101 according to Comparative Example.

The amplifier circuit 101 according to Comparative Example includes an amplifier 30, a first switch circuit 41, and a second switch circuit 46. In addition, the amplifier circuit 101 includes a first terminal 11 and a second terminal 12.

The amplifier 30 is disposed in a first path 21 connecting the first terminal 11 and the second terminal 12. The first switch circuit 41 is disposed in the first path 21 between the amplifier 30 and the second terminal 12. The second switch circuit 46 is disposed in a second path 22 that bypasses the amplifier 30 and the first switch circuit 41, and is connected to the first terminal 11 and the second terminal 12. Specifically, one end of the second path 22 is connected to a first node n1 between the first terminal 11 and the amplifier 30, and another end of the second path 22 is connected to a second node n2 between the first switch circuit 41 and the second terminal 12.

In the amplifier circuit 101, when an input high-frequency signal is amplified and outputted, the amplifier 30 is turned on, the first switch circuit 41 is set to a conductive state, and the second switch circuit 46 is set to a non-conductive state. When the input high-frequency signal is made to pass along the second path 22 and outputted without necessarily amplifying, the amplifier 30 is turned off, the first switch circuit 41 is set to a non-conductive state, and the second switch circuit 46 is set to a conductive state.

Figure 2:
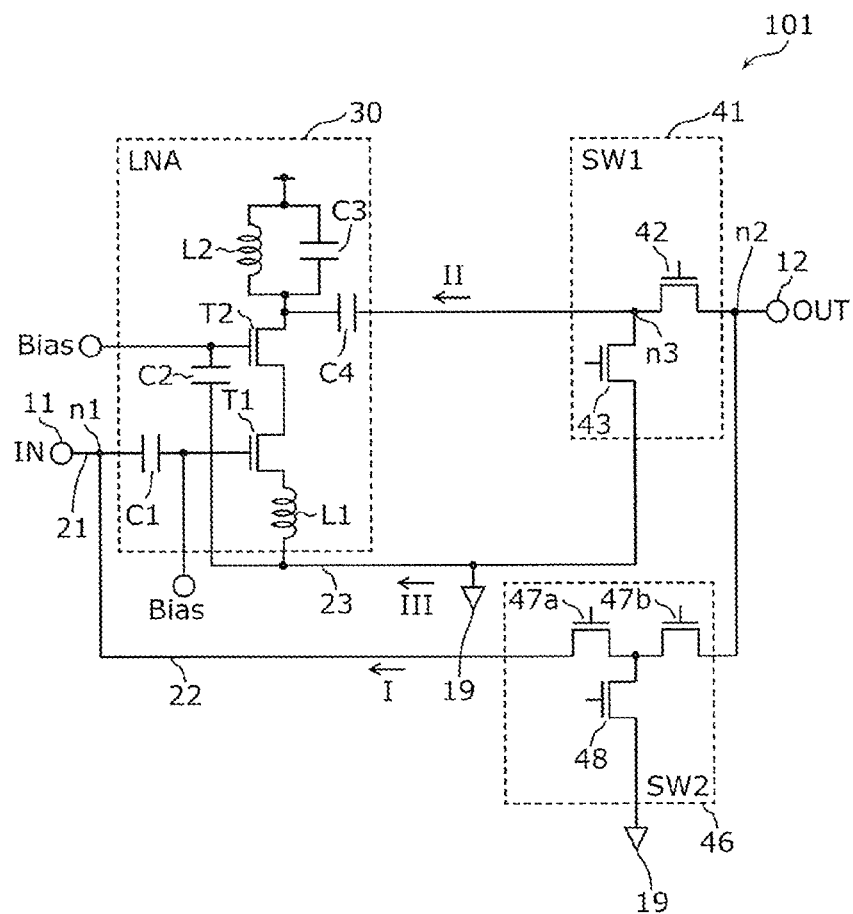
FIG. 2 is a circuit diagram illustrating the amplifier circuit according to Comparative Example.

A problem that may occur in the amplifier circuit 101 of Comparative Example will be described with reference to FIG. 2. FIG. 2 is a circuit diagram illustrating the amplifier circuit 101 according to Comparative Example.

For example, in the amplifier circuit 101 having a path that bypasses the amplifier 30 as in Comparative Example, when an input high-frequency signal is amplified and outputted without necessarily passing along the second path 22, feedbacks I and II that are undesirable for the amplifier circuit 101 occur.

The feedback I occurs in a signal path in which a signal outputted from the amplifier 30 and a signal reflected by the output terminal (OUT) return from the second node n2 to the first node n1 via the second path 22, and are input to the amplifier 30 again. When a high-frequency signal is amplified, switches 47a and 47b are non-conductive, but the high-frequency signal jumps and propagates between the contacts of the switches 47b and 47a due to capacitive coupling or the like between both contacts of the switch 47b and both contacts of the switch 47a, and the feedback I occurs. The signal input to the amplifier 30 again by the feedback I is amplified by the amplifier 30 together with a signal input from the first terminal 11, and is input again to the amplifier 30 via the second path 22. When the feedback I is repeated, the amplifier circuit 101 becomes unstable and easily oscillates. The amplifier circuit 101 has capacitance (capacity) and inductance in the circuit, and enters an oscillation (resonance) state when resonance conditions according to those values are prepared. The capacitance and the inductance include parasitic components not intended by the designer, and it is difficult to specify the frequency at which oscillation occurs during the design phase.

The feedback II occurs in a path in which a signal reflected at the output terminal travels in the first path 21 from the output terminal side to the output side of the amplifier 30, enters the output terminal of the amplifier 30, and reaches the input terminal of the amplifier 30 via the inside of the amplifier 30 (internal parasitic capacitance). The signal sneaking into the input side of the amplifier 30 by the feedback II causes the amplifier circuit 101 to be unstable and easily oscillate.

In addition, in the amplifier circuit 101 of Comparative Example, the following undesirable feedback III may occur.

For example, as illustrated in FIG. 2, the feedback III occurs when a switch 43 of the first switch circuit 41 and the amplifier 30 are connected to a ground terminal 19 in common. The feedback III occurs in a signal path in which the signal outputted from the amplifier 30 and the signal reflected by the output terminal return from a third node n3 to the amplifier 30 via a line 23 connected to the ground. When a high-frequency signal is amplified, the switch 43 is non-conductive, but the high-frequency signal jumps and propagates between the contacts of the switch 43 due to the capacitive coupling or the like between both contacts of the switch 43, and the feedback III occurs. The signal returned to the amplifier 30 by the feedback III causes the amplifier circuit 101 to be unstable and easily oscillate.

In contrast to Comparative Example described above, an amplifier circuit according to the present embodiment includes an attenuator at a stage subsequent to the amplifier 30. Accordingly, the amplifier circuit according to the present embodiment can suppress the unstableness of the amplifier circuit.

Hereinafter, embodiments of the present disclosure will be described in detail with reference to the drawings. It should be noted that each of the embodiments described below represents a comprehensive or specific example. Numerical values, shapes, materials, constituent elements, arrangements and connection forms of the constituent elements, and the like described in the following embodiments are merely examples and are not intended to limit the present disclosure. Among the constituent elements in the following embodiments, constituent elements that are not described in the independent claims are described as optional constituent elements. In addition, the sizes or the size ratios of the constituent elements illustrated in the drawings are not necessarily strict.

Embodiment 1

[1-1. Configuration of Amplifier Circuit]

Figure 3:
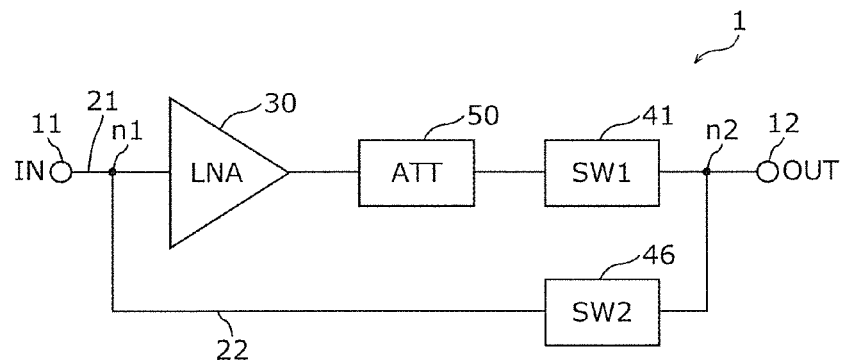
FIG. 3 is a block diagram of an amplifier circuit according to Embodiment 1.
Figure 4:
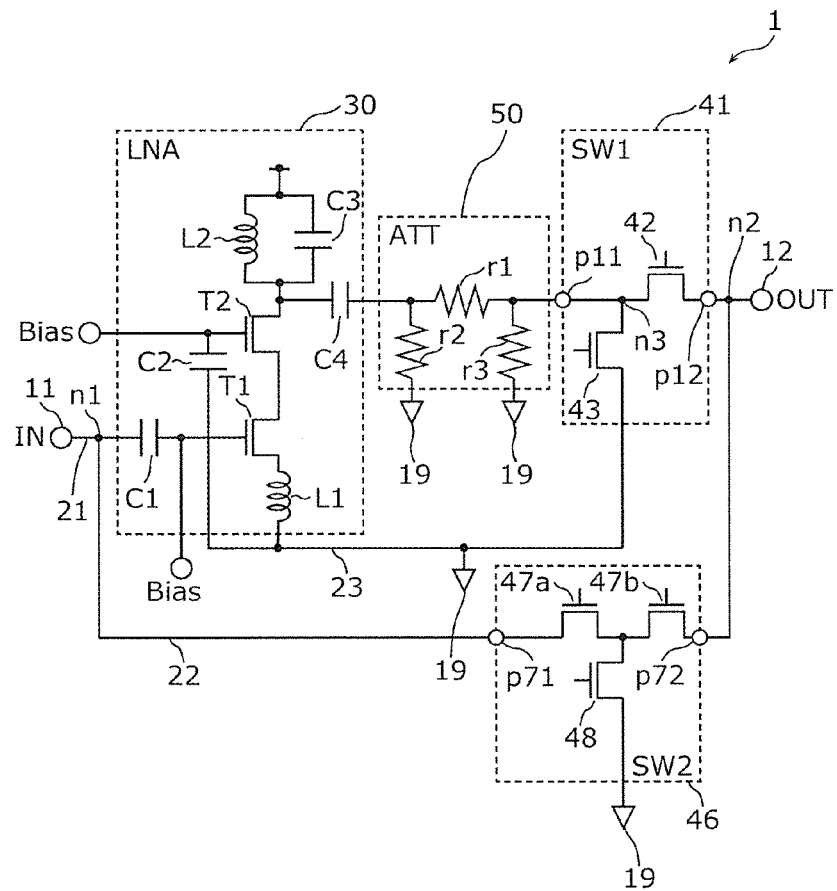
FIG. 4 is a circuit diagram illustrating the amplifier circuit according to Embodiment 1.

Referring to FIGS. 3 and 4, an amplifier circuit 1 according to Embodiment 1 will be described. Note that although some constituent elements are common between Embodiment 1 and Comparative Example 1, Embodiment 1 including the common constituent elements will be newly described.

FIG. 3 is a block diagram of the amplifier circuit 1 according to Embodiment 1. The amplifier circuit 1 is included, for example, in a receiver circuit that receives a high-frequency signal. Examples of the high-frequency signal include a high-frequency signal in a 2.4 GHz band or a 5 GHz band, which conforms to the IEEE 802.11 standard or a high-frequency signal in a 1 GHz band.

As illustrated in FIG. 3, the amplifier circuit 1 includes the amplifier 30, an attenuator 50, the first switch circuit 41, and the second switch circuit 46. In addition, the amplifier circuit 1 includes the first terminal 11 and the second terminal 12.

The amplifier 30 is disposed in the first path 21 connecting the first terminal 11 and the second terminal 12. The first switch circuit 41 is disposed in the first path 21 between the amplifier 30 and the second terminal 12. The attenuator 50 is disposed in the first path 21 between the amplifier 30 and the first switch circuit 41. That is, the amplifier 30, the attenuator 50, and the first switch circuit 41 are connected in series in the first path 21 in this order.

The second switch circuit 46 is disposed in the second path 22 that bypasses the amplifier 30, the attenuator 50, and the first switch circuit 41, and is connected to the first terminal 11 and the second terminal 12. Specifically, the one end of the second path 22 is connected to the first node n1 between the first terminal 11 and the amplifier 30, and the other end of the second path 22 is connected to the second node n2 between the first switch circuit 41 and the second terminal 12.

Next, the operation of the amplifier circuit 1 will be described with reference to FIG. 4. FIG. 4 is a circuit diagram illustrating the amplifier circuit 1.

The first switch circuit 41 includes a series-connected switch 42 and a ground-connected switch 43. The second switch circuit 46 includes series-connected switches 47a and 47b and a ground-connected switch 48.

In the amplifier circuit 1, when an input high-frequency signal is amplified and outputted, the amplifier 30 is turned on, the first switch circuit 41 is set to a conductive state, and the second switch circuit 46 is set to a non-conductive state. In order to set the first switch circuit 41 in the conductive state, the series-connected switch 42 is turned on (conductive), and the ground-connected switch 43 is turned off (non-conductive). In order to set the second switch circuit 46 in the non-conductive state, the series-connected switches 47a and 47b are turned off (non-conductive), and the ground-connected switch 48 is turned on (conductive).

When an input high-frequency signal is made to pass along the second path 22 and outputted without necessarily amplifying, the amplifier 30 is turned off, the first switch circuit 41 is set to a non-conductive state, and the second switch circuit 46 is set to a conductive state. In order to set the first switch circuit 41 in the non-conductive state, the series-connected switch 42 is turned off (non-conductive), and the ground-connected switch 43 is turned on (conductive). In order to set the second switch circuit 46 in the conductive state, the series-connected switches 47a and 47b are turned on (conductive), and the ground-connected switch 48 is turned off (non-conductive).

Next, each configuration of the amplifier circuit 1 will be described.

The amplifier 30 includes cascode-connected transistors T1 and T2. A high-frequency signal input from the first terminal 11 to the amplifier 30 is amplified by the transistors T1 and T2. For example, a gain of the amplifier 30 is 10 dB or more and 30 dB or less when a frequency of the signal input to the first terminal 11 is 1 GHz. Each of the transistors T1 and T2 in the present embodiment is an n-type field effect transistor, but is not limited thereto, and may be a p-type field effect transistor, or a bipolar transistor.

A DC cut capacitor C1 and a bias terminal for applying a bias voltage are connected to a gate (control terminal) of the transistor T1. One end of an inductor L1 is connected to a source (current output terminal) of the transistor T1. Another end of the inductor L1 is connected via the line 23 to the ground terminal 19 which is a common terminal for ground connection. That is, the source of the transistor T1 is connected to the ground terminal via the inductor L1.

A source of the transistor T2 is connected to a drain (current input terminal) of the transistor T1. The bias terminal and one end of the capacitor C2 are connected to a gate of the transistor T2. Another end of the capacitor C2 is connected via the line 23 to the ground terminal 19. That is, the transistor T2 is connected to the ground terminal 19 via the capacitor C2.

To a drain of the transistor T2, an inductor L2 and a capacitor C3 disposed in parallel with each other are connected, and a DC cut capacitor C4 is connected. A high-frequency signal amplified by the transistors T1 and T2 is outputted via the capacitor C4. Note that the inductor L2 and the capacitors C3 and C4 also function as a matching circuit of the amplifier 30.

The attenuator 50 is connected between the amplifier 30 and the first switch circuit 41. For example, the attenuation of the attenuator 50 is 0.1 dB or more and 1 dB or less when a frequency of a signal input to the first terminal 11 is 1 GHz. The numerical value when the attenuation of the attenuator 50 is expressed in decibels is smaller than the numerical value when the gain of the amplifier 30 is expressed in decibels ($1/10$ or less).

The attenuator 50 is a π-type attenuator constituted by a plurality of resistors r1, r2, and r3, and is capable of attenuating each of the signals input from the both directions. The resistor r1 is connected in series to the capacitor C4 of the amplifier 30. The resistor r2 is disposed between a node between the capacitor C4 and the resistor r1 and the ground terminal 19. The resistor r3 is disposed between a node between the resistor r1 and the first switch circuit 41 and the ground terminal 19. In the present embodiment, since the oscillation of the amplifier circuit 1 can be suppressed even when the attenuation of the attenuator 50 is small, it is desirable to reduce the signal loss due to the attenuator 50 as much as possible. Therefore, the resistance value of the resistor r1 is designed to be small, and the resistance values of the resistors r2 and r3 are designed to be large. For example, at 1 GHz, the resistance value of the resistor r1 is smaller than the resistance value of the resistor r2 and smaller than the resistance value of the resistor r3.

The first switch circuit 41 includes one terminal p11 and another terminal p12. The one terminal p11 is connected to the output side of the attenuator 50, and the other terminal p12 is connected to the second terminal 12. The series-connected switch 42 of the first switch circuit 41 is disposed between the one terminal p11 and the other terminal p12, and the ground-connected switch 43 is disposed between the third node n3 between the one terminal p11 and the series-connected switch 42 and the ground terminal 19. Specifically, one end of the ground-connected switch 43 is connected to the node n3, and another end of the ground-connected switch 43 is connected to the ground terminal 19.

The ground-connected switch 43 is a switch that suppresses jumping of the high-frequency signal over the series-connected switch 42 from the node n2 side and entering to the output side of the amplifier 30 when the high-frequency signal is made to pass along the second path 22. By tuning on the ground-connected switch 43, the potential of the node n3 is set to 0 V, and entering of the high-frequency signal that passes along the second path 22 to the output side of the amplifier 30 is suppressed. Thereby, it is possible to prevent the impedance of the bypass path from unintentionally fluctuating. On the other hand, the amplifier circuit 1 having the above-described configuration has a configuration in which, when a high-frequency signal is amplified, the signal input from the node n3 by jumping over the ground-connected switch 43 easily propagates through the line 23 and returns to the amplifier 30.

The second switch circuit 46 includes one terminal p71 and another terminal p72. The one terminal p71 is connected to the node n1, and the other terminal p72 is connected to the node n2. The series-connected switches 47a and 47b of the second switch circuit 46 are disposed in series between the one terminal p71 and the other terminal p72, and the ground-connected switch 48 is disposed between a node between the series-connected switches 47a and 47b and the ground terminal 19. Specifically, one end of the ground-connected switch 48 is connected to the node between the series-connected switches 47a and 47b, and another end of the ground-connected switch 48 is connected to the ground terminal 19.

Note that each of the series-connected switches 42, 47a, and 47b, and the ground-connected switches 43 and 48 may be a switch using a transistor, or a micro electro mechanical systems (MEMS) switch.

[1-2. Effects and the Like]

Figure 5A:
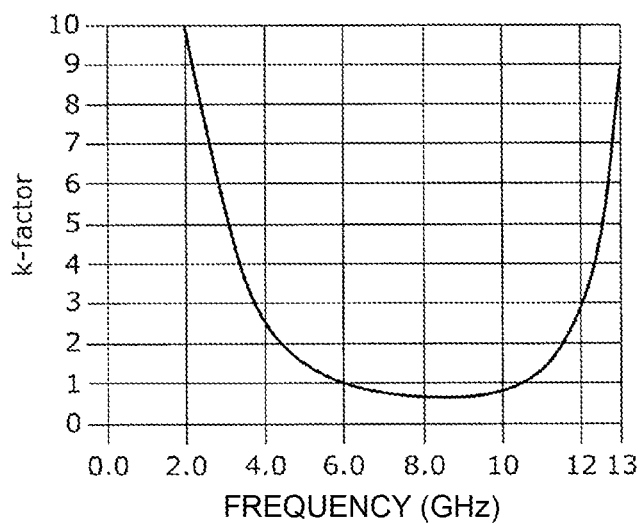
FIG. 5A is a view that indicates a stability factor of the amplifier circuit according to Comparative Example.
Figure 5B:
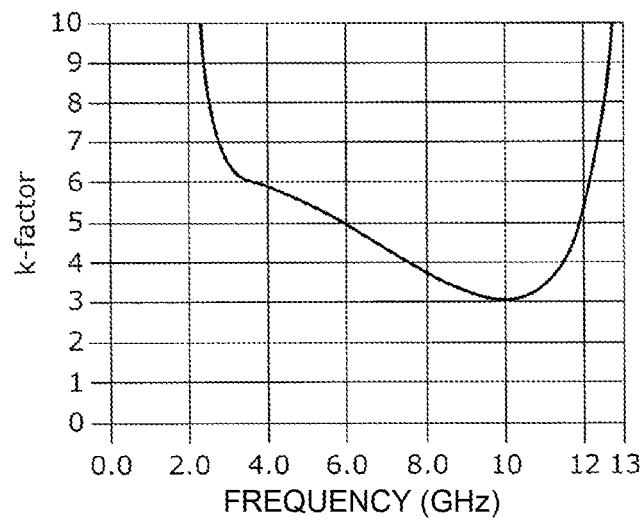
FIG. 5B is a view that indicates a stability factor of the amplifier circuit according to Embodiment 1.

The effects and the like of the amplifier circuit 1 will be described with reference to FIGS. 5A and 5B. FIG. 5A is a view that indicates a stability factor of the amplifier circuit 101 according to Comparative Example, and FIG. 5B is a view that indicates a stability factor of the amplifier circuit 1 according to Embodiment 1. The stability factor (k-factor) was obtained from S-parameters at frequencies from 2 GHz to 13 GHz.

According to these views, the amplifier circuit 101 of Comparative Example has the frequency bands in which the stability factor is 1 or less, whereas the amplifier circuit 1 of the present embodiment has stability factors of 3 or more. That is, the amplifier circuit 1 of the present embodiment has larger stability factors and is more stable than the amplifier circuit 101 of Comparative Example.

The amplifier circuit 1 according to the present embodiment includes: the first terminal 11 and the second terminal 12; the amplifier 30 disposed in the first path 21 connecting the first terminal 11 and the second terminal 12; the first switch circuit 41 disposed in the first path 21 between the amplifier 30 and the second terminal 12; the attenuator 50 disposed in the first path 21 between the amplifier 30 and the first switch circuit 41; and the second switch circuit 46 disposed in the second path 22 that is connected to the first terminal 11 and the second terminal 12 while bypassing the amplifier 30, the attenuator 50, and the first switch circuit 41.

As described above, since the attenuator 50 is disposed between the amplifier 30 and the first switch circuit 41, that is, at a stage subsequent to the amplifier 30 (on the second terminal 12 side of the amplifier 30), it is possible to prevent the signal reflected back from the second terminal 12 from entering the inside of the amplifier 30. It is also possible to reduce the unintended feedback I and III signal levels. From the above, there is an effect of suppressing the oscillation due to the positive feedback. In other words, by providing the attenuator 50 to the amplifier 30, the Q value of the resonance frequency of the amplifier circuit 1 can be appropriately set to be low. Specifically, by decreasing the Q value at the resonance frequency of the resonance generated by the capacitance and the inductance in the circuit of the amplifier circuit 1, it is possible to reduce the resonance energy and the unstableness of the amplifier circuit 1 can be suppressed.

Unlike the present embodiment, when the attenuator 50 is disposed at a stage preceding the amplifier 30 (on the first terminal 11 side rather than the amplifier 30), since a small signal before amplification is attenuated by the attenuator 50, it is undesirable and since the noise generated by the resistor element of the attenuator 50 is amplified by the amplifier 30, it is undesirable. On the other hand, in the amplifier circuit 1 of the present embodiment, since the attenuator 50 is disposed at the subsequent stage of the amplifier 30, a small signal before amplification is not attenuated by the attenuator 50, and the signal is not amplified with the noise added by the attenuator 50. In the amplifier circuit 1 of the present embodiment, after the signal is amplified by the amplifier 30, the small noise due to the attenuator 50 is added, and the influence on the output signal of the amplifier circuit 1 is small.

Unlike the present embodiment, when the attenuator 50 is disposed between the node n2 and the second terminal 12, after a signal is made to pass along the second path 22, the signal is attenuated by the attenuator 50, which is not desirable. In the amplifier circuit 1 according to the present embodiment, since the attenuator 50 is disposed between the amplifier 30 and the first switch circuit 41, it is possible to output a signal that passes along the second path 22 without necessarily being attenuated by the attenuator 50.

As described above, in the present embodiment, the attenuator 50 is disposed between the first node n1 and the second node n2, which are the points connecting the first path 21 and the second path 22, at the stage subsequent to the amplifier 30 (the second terminal 12 side rather than the amplifier 30), so that it is possible to suppress the unstableness of the amplifier circuit 1 while avoiding unnecessary attenuation and addition of noise.

The first switch circuit 41 includes the one terminal p11, the other terminal p12, the series-connected switch 42 disposed between the one terminal p11 and the other terminal p12, and the ground-connected switch 43 disposed between the node n3 between the first terminal p11 and the series-connected switch 42 and the ground terminal 19. The one end of the ground-connected switch 43 is connected to the node n3, the other end of the ground-connected switch 43 is connected to the ground terminal 19, and the amplifier 30 is connected to the ground terminal 19.

As described above, even in the circuit configuration in which the ground terminal 19 is shared and the feedback III is likely to occur, since the attenuator 50 is disposed at the stage subsequent to the amplifier 30, it is possible to reduce the unintended feedback III signal level, and to suppress the oscillation. Thereby, it is possible to suppress the unstableness of the amplifier circuit 1.

The attenuator 50 is a π-type attenuator constituted by the plurality of resistors r1, r2, and r3.

Thus, when the attenuator 50 is a π-type attenuator, the area of the amplifier circuit 1 can be reduced, for example, as compared with a case where the attenuator 50 is a T-type attenuator. Specifically, the resistor r1, which is disposed in series in the first path 21, is selected to have a small resistance value in order to reduce the loss. However, in order to reduce the resistance value, it is necessary to increase the width of the resistor element, and the area of the attenuator 50 is increased. When the attenuator 50 is the π-type attenuator, the number of resistor elements disposed in series can be reduced as compared with the T-type attenuator, and the area of the attenuator 50 and the amplifier circuit 1 can be reduced.

When a frequency of a signal input to the first terminal 11 is 1 GHz, a gain of the amplifier 30 is 10 dB or more and 30 dB or less, and attenuation of the attenuator 50 is 0.1 dB or more and 1 dB or less.

According to this configuration, it is possible to prevent the signal reflected back from the second terminal 12 from entering the inside of the amplifier 30. Further, it is possible to reduce the unintended feedback I and III signal levels, and it is possible to suppress the oscillation.

(Modification 1)

Figure 6:
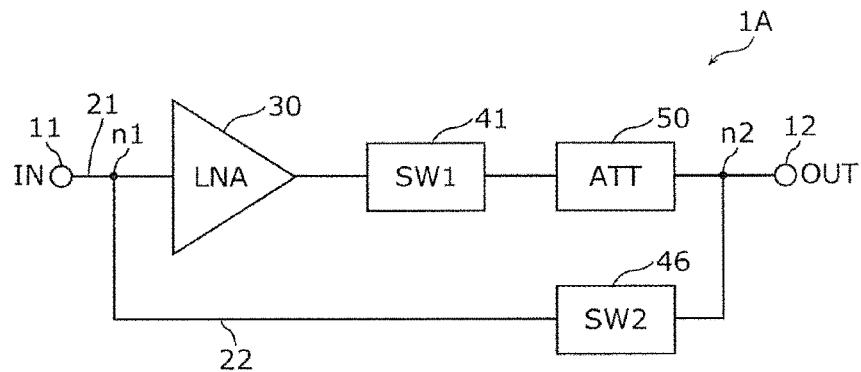
FIG. 6 is a block diagram of an amplifier circuit according to Modification 1 of Embodiment 1.

FIG. 6 is a block diagram of an amplifier circuit 1A according to Modification 1 of Embodiment 1. In the amplifier circuit 1A according to Modification 1, the attenuator 50 is disposed between the first switch circuit 41 and the second terminal 12.

In the amplifier circuit 1A of the modification, the amplifier 30, the first switch circuit 41, and the attenuator 50 are connected in series in the first path 21 in this order.

As described above, since the attenuator 50 is disposed between the first switch circuit 41 and the second terminal 12, that is, at the stage subsequent to the amplifier 30, it is possible to reduce a high-frequency signal amplified more than necessary by the amplifier 30 to a level such that the oscillation does not occur, and to suppress the unstableness of the amplifier circuit 1A.

(Modification 2)

Figure 7:
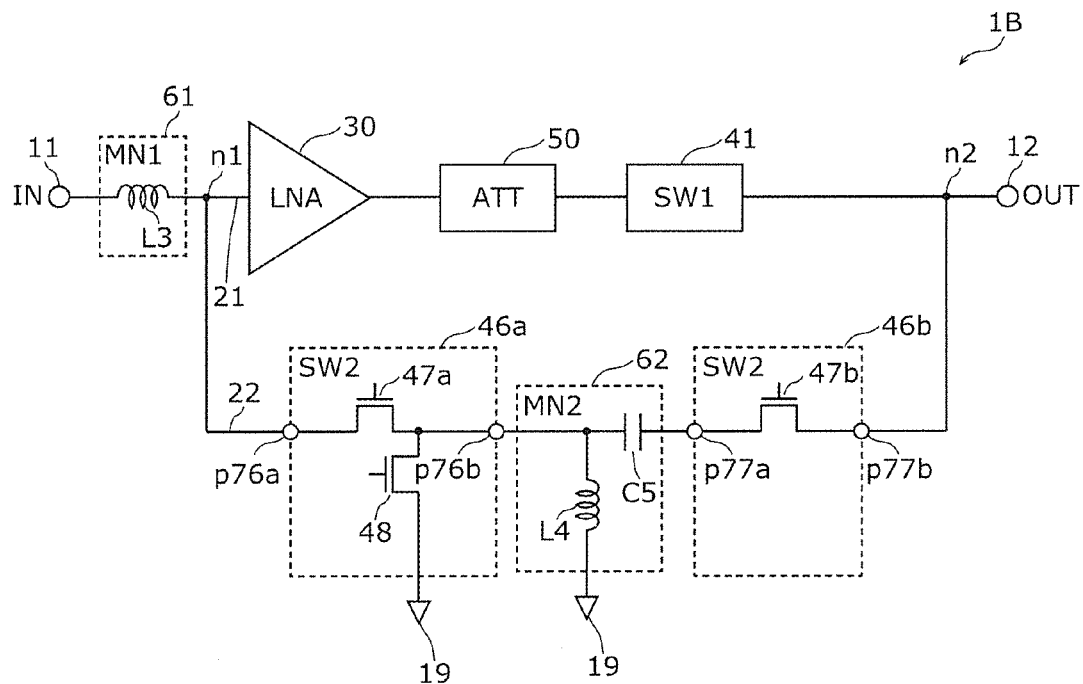
FIG. 7 is a block diagram of an amplifier circuit according to Modification 2 of Embodiment 1.

FIG. 7 is a block diagram of an amplifier circuit 1B according to Modification 2 of Embodiment 1. The amplifier circuit 1B according to Modification 2 further includes a first matching circuit 61 and a second matching circuit 62.

The first matching circuit 61 is a circuit for matching the impedance between the amplifier 30 and the first terminal 11, and is disposed between the first terminal 11 and the amplifier 30. The first matching circuit 61 is, for example, an inductor L3 connected in series to the amplifier 30. One end of the inductor L3 is connected to the first terminal 11, and another end thereof is connected to the amplifier 30 via the node n1.

The second switch circuit 46 includes two switch circuits 46a and 46b.

The switch circuit 46a includes one terminal p76a, another terminal p76b, the series-connected switch 47a, and the ground-connected switch 48. The one terminal p76a is connected to the node n1. The series-connected switch 47a is disposed in series between the one terminal p76a and the other terminal p76b, and the ground-connected switch 48 is disposed between a node between the series-connected switch 47a and the other terminal p76b and the ground terminal 19.

The switch circuit 46b includes one terminal p77a and another terminal p77b, and the series-connected switch 47b. The other terminal p77b is connected to the node n2. The series-connected switch 47b is disposed in series between the one terminal p77a and the other terminal p77b.

The second matching circuit 62 is a circuit for correcting and matching the impedance mismatch occurring in the second path 22 due to the provision of the first matching circuit 61. The second matching circuit 62 is disposed in the second path 22 between the switch circuits 46a and 46b. The second matching circuit 62 is constituted of, for example, a capacitor C5 disposed in series between the switch circuits 46a and 46b, and an inductor L4 disposed between a node between the switch circuit 46a and the capacitor C5 and the ground terminal 19.

In the amplifier circuit 1B according to Modification 2, the one end of the second path 22 is connected to the node n1 between the first terminal 11 and the amplifier 30, and the first matching circuit 61 is disposed between the first terminal 11 and the node n1. The second switch circuit 46 includes a plurality of series-connected switches 47a and 47b disposed in series in the second path 22, and the second matching circuit 62 is disposed between the series-connected switches 47a and 47b.

As described above, even when the first matching circuit 61 is connected to the amplifier 30, the impedance in the second path 22 can be matched by providing the second matching circuit 62 in the second path 22. Thus, the state of the amplifier circuit 1B can be stabilized.

Also in Modification 2, since the attenuator 50 is disposed at the stage subsequent to the amplifier 30, the signal reflected back from the second terminal 12 can be prevented from entering the inside of the amplifier 30. Further, it is possible to reduce the unintended feedback I and III signal levels, and it is possible to suppress the oscillation.

(Modification 3)

Figure 8:
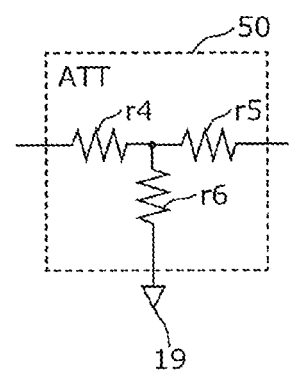
FIG. 8 is a diagram illustrating an attenuator in an amplifier circuit according to Modification 3 of Embodiment 1.

FIG. 8 is a diagram illustrating an attenuator 50 in an amplifier circuit according to Modification 3 of Embodiment 1. In the amplifier circuit according to Modification 3, the attenuator 50 is a T-type attenuator constituted by a plurality of resistors r4, r5, and r6.

The attenuator 50 in Modification 3 can also attenuate each of the signals input from both directions. The resistors r4 and r5 are connected in series to the capacitor C4 of the amplifier 30 in this order. The resistor r6 is disposed between a node between the resistors r4 and r5 and the ground terminal 19. In Modification 3, since the oscillation of the amplifier circuit can be suppressed even when the attenuation of the attenuator 50 is small, it is desirable to reduce the signal loss due to the attenuator 50 as much as possible.

Therefore, the resistance values of the resistors r4 and r5 are designed to be small, and the resistance value of the resistor r6 is designed to be large. For example, at 1 GHz, each resistance value of the resistors r4 and r5 is smaller than the resistance value of the resistor r6.

Also in Modification 3, since the attenuator 50 is disposed at the stage subsequent to the amplifier 30, the signal reflected back from the second terminal 12 can be prevented from entering the inside of the amplifier 30. Further, it is possible to reduce the unintended feedback I and III signal levels, and it is possible to suppress the oscillation.

Embodiment 2

Figure 9:
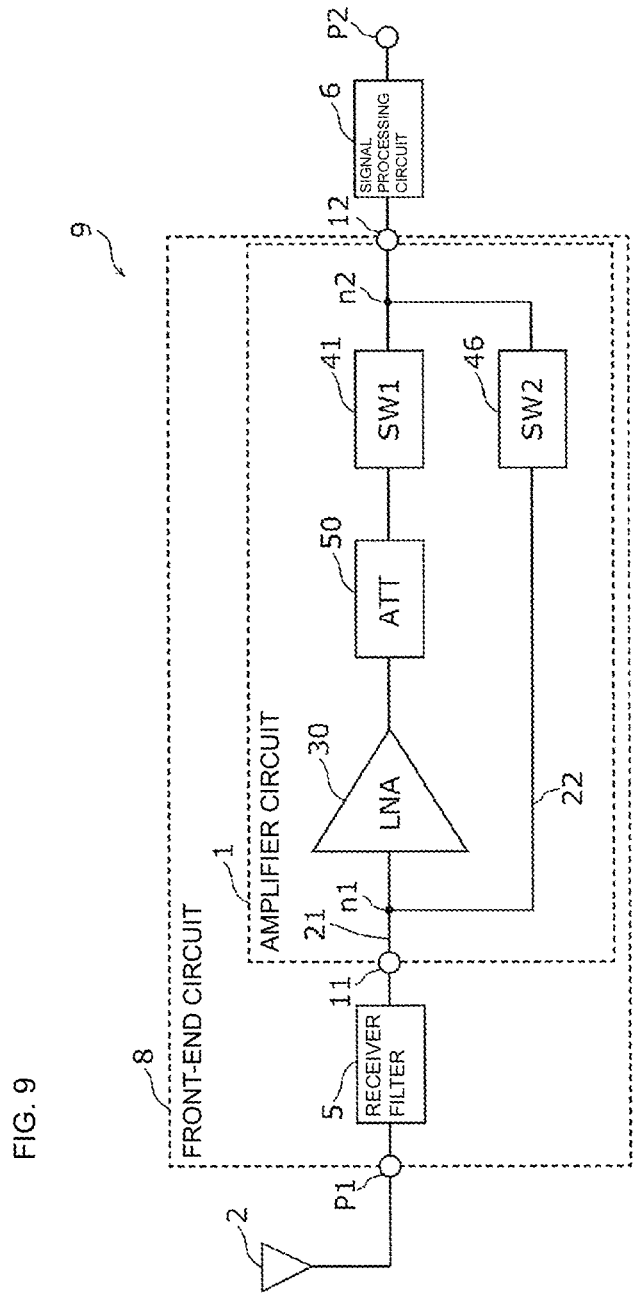
FIG. 9 is a block diagram of a receiver circuit according to Embodiment 2.

Referring to FIG. 9, a receiver circuit 9 according to Embodiment 2 will be described. FIG. 9 is a block diagram of the receiver circuit 9. FIG. 9 illustrates the diagram in which an antenna element 2 is connected to the receiver circuit 9.

The receiver circuit 9 includes a front-end circuit 8, a signal processing circuit 6, a first terminal (input-side terminal) P1, and a second terminal (output-side terminal) P2. The front-end circuit 8 includes a receiver filter 5 and the amplifier circuit 1.

The receiver filter 5 is disposed between the first terminal P1 and the amplifier circuit 1. The receiver filter 5 filters signals in a reception frequency band among high-frequency signals input via the antenna element 2 and the first terminal P1, and passes the filtered signals. The received signals outputted from the receiver filter 5 are input to the amplifier circuit 1. The receiver filter 5 is, for example, a surface acoustic wave (SAW) filter. Also, the receiver filter 5 may be, for example, a bulk acoustic wave (BAW) filter.

The amplifier circuit 1, which is the amplifier circuit 1 described in Embodiment 1, amplifies the high-frequency signal input from the receiver filter 5, and outputs the amplified high-frequency signal to the signal processing circuit 6.

The signal processing circuit 6 is, for example, an RF signal processing circuit (RFIC) and a baseband signal processing circuit (BBIC). The RF signal processing circuit processes the high-frequency received signal input from the amplifier circuit 1 by down-conversion or the like, and outputs the received signal generated by the signal processing to the baseband signal processing circuit. The baseband signal processing circuit is a circuit that processes a signal by using an intermediate frequency band lower in frequency than the high-frequency signal in the receiver circuit 9.

The receiver circuit 9 according to the present embodiment is the receiver circuit 9 including the amplifier circuit 1 described in Embodiment 1. Thereby, it is possible to suppress the unstableness of the receiver circuit 9.

Other Embodiments and the Like

The amplifier circuits 1 to 1B and the receiver circuit 9 according to the embodiments of the present disclosure are described above, but the present disclosure is not limited to the above-described embodiments. For example, aspects in which the following modifications are applied to the above-described embodiments may also be included in the present disclosure.

For example, the amplifier circuit 1 may be configured to amplify a high-frequency signal conforming a standard other than the IEEE 802.11 standard (for example, the LTE standard or the W-CDMA standard).

For example, the receiver circuit 9 may be configured to include a plurality of receiver filters in the circuit, for example, and to receive signals in a plurality of different frequency bands by a band switch performing switching.

The attenuator 50 is not limited to an attenuator that attenuates signals in both directions, and may be an attenuator that attenuates signals in one direction. For example, the attenuator 50 may be an L-type attenuator constituted by the resistors r4 and r6, or may be an L-type attenuator constituted by the resistors r5 and r6.

INDUSTRIAL APPLICABILITY

The present disclosure can be widely used in communication devices as an amplifier circuit and a receiver circuit capable of maintaining a stable state.

REFERENCE SIGNS LIST 1, 1A, 1B AMPLIFIER CIRCUIT
2 ANTENNA ELEMENT
5 RECEIVER FILTER (FILTER)
6 SIGNAL PROCESSING CIRCUIT
8 FRONT-END CIRCUIT
9 RECEIVER CIRCUIT
11 FIRST TERMINAL
12 SECOND TERMINAL
19 GROUND TERMINAL
21 FIRST PATH
22 SECOND PATH
23 LINE
30 AMPLIFIER
41 FIRST SWITCH CIRCUIT
42 SERIES-CONNECTED SWITCH
43 GROUND-CONNECTED SWITCH
46 SECOND SWITCH CIRCUIT
47a, 47b SERIES-CONNECTED SWITCH
48 GROUND-CONNECTED SWITCH
50 ATTENUATOR
61 FIRST MATCHING CIRCUIT
62 SECOND MATCHING CIRCUIT
C1, C2, C3, C4, C5 CAPACITOR
L1, L2, L3, L4 INDUCTOR
P1, P2 TERMINAL
p11, p71, p76a, p77a ONE TERMINAL
p12, p72, p76b, p77b ANOTHER TERMINAL
n1, n2, n3 NODE
r1, r2, r3, r4, r5, r6 RESISTOR
T1, T2 TRANSISTOR

What is claimed is:

1. An amplifier circuit comprising:
a first terminal and a second terminal;
an amplifier in a first path connecting the first terminal and the second terminal;
a first switch circuit in the first path between the amplifier and the second terminal;
an attenuator in the first path between the amplifier and the first switch circuit, or between the first switch circuit and the second terminal; and
a second switch circuit in a second path, the second path connecting the first terminal and the second terminal, and bypassing the amplifier, the attenuator, and the first switch circuit,
wherein the first switch circuit and the attenuator are connected to an output side of the amplifier.

2. The amplifier circuit according to claim 1, wherein the attenuator is between the amplifier and the first switch circuit.

3. The amplifier circuit according to claim 2, wherein:
the first switch circuit comprises two terminals and a series-connected switch between the two terminals, and comprises a ground-connected switch between a ground terminal and a node between one of the two terminals and the series-connected switch,
a first end of the ground-connected switch is connected to the node, and a second end of the ground-connected switch is connected to the ground terminal, and
the amplifier is connected to the ground terminal.

4. The amplifier circuit according to claim 1, wherein the attenuator is between the first switch circuit and the second terminal.

5. The amplifier circuit according to claim 1, wherein:
a first end of the second path is connected to a node between the first terminal and the amplifier,
a first matching circuit is between the first terminal and the node,
the second switch circuit comprises a plurality of series-connected switches that are in series with each other in the second path, and
the amplifier circuit further comprises a second matching circuit between two of the plurality of series-connected switches.

6. The amplifier circuit according to claim 1, wherein the attenuator is a π-type attenuator comprising a plurality of resistors.

7. The amplifier circuit according to claim 1, wherein the attenuator is a T-type attenuator comprising a plurality of resistors.

8. The amplifier circuit according to claim 1, wherein, when a frequency of a signal input to the first terminal is 1 GHz:
a gain of the amplifier is greater than or equal to 10 dB and less than or equal to 30 dB, and
attenuation of the attenuator is greater than or equal to 0.1 dB and less than or equal to 1 dB.

9. A front-end circuit comprising:
the amplifier circuit according to claim 1; and
a filter connected to the first terminal.

10. A receiver circuit comprising:
the front-end circuit according to claim 9; and
a signal processing circuit connected to the second terminal.

* * * * *